United States Patent
Haba et al.

(10) Patent No.: US 7,816,251 B2
(45) Date of Patent: Oct. 19, 2010

(54) FORMATION OF CIRCUITRY WITH MODIFICATION OF FEATURE HEIGHT

(75) Inventors: Belgacem Haba, Saratoga, CA (US); Masud Beroz, San Jose, CA (US); Young-Gon Kim, San Jose, CA (US); David B. Tuckerman, Lafayette, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 12/291,853

(22) Filed: Nov. 14, 2008

(65) Prior Publication Data

US 2009/0071000 A1 Mar. 19, 2009

Related U.S. Application Data

(62) Division of application No. 10/959,465, filed on Oct. 6, 2004, now Pat. No. 7,462,936.

(60) Provisional application No. 60/508,970, filed on Oct. 6, 2003, provisional application No. 60/533,210, filed on Dec. 30, 2003, provisional application No. 60/533, 393, filed on Dec. 30, 2003, provisional application No. 60/533,437, filed on Dec. 30, 2003.

(51) Int. Cl.
  *H01L 21/44* (2006.01)
(52) U.S. Cl. .................... 438/613; 257/E21.509
(58) Field of Classification Search .................. 438/613; 257/E21.509
  See application file for complete search history.

(56) References Cited

U.S. PATENT DOCUMENTS

| | | |
|---|---|---|
| 4,695,870 A | 9/1987 | Patraw |
| 4,716,049 A | 12/1987 | Patraw |
| 4,804,132 A | 2/1989 | DiFrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 5,068,714 A | 11/1991 | Seipler |
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,189,505 A | 2/1993 | Bartelink |

(Continued)

FOREIGN PATENT DOCUMENTS

EP 1602749 12/2005

(Continued)

OTHER PUBLICATIONS

North Corporation, "Processed Intra-layer Interconnection Material for PWBs [Etched Copper Bump with Copper Foil]," NMBI™, Version 2001.6.

(Continued)

*Primary Examiner*—Lex Malsawma
(74) *Attorney, Agent, or Firm*—Lerner, David, Littenberg, Krumholz & Mentlik, LLP

(57) ABSTRACT

A connection component for mounting a chip or other microelectronic element is formed from a starting unit including posts projecting from a dielectric element by crushing or otherwise reducing the height of at least some of the posts.

15 Claims, 5 Drawing Sheets

U.S. PATENT DOCUMENTS

| | | |
|---|---|---|
| 5,196,726 A | 3/1993 | Nishiguchi et al. |
| 5,214,308 A | 5/1993 | Nishiguchi et al. |
| 5,397,997 A | 3/1995 | Tuckerman et al. |
| 5,409,865 A | 4/1995 | Karnezos |
| 5,455,390 A | 10/1995 | DiStefano et al. |
| 5,518,964 A | 5/1996 | DiStefano et al. |
| 5,615,824 A | 4/1997 | Fjelstad et al. |
| 5,656,550 A | 8/1997 | Tsuji et al. |
| 5,659,952 A | 8/1997 | Kovac et al. |
| 5,679,977 A | 10/1997 | Khandros et al. |
| 5,731,709 A | 3/1998 | Pastore et al. |
| 5,798,286 A | 8/1998 | Faraci et al. |
| 5,802,699 A | 9/1998 | Fjelstad et al. |
| 5,811,982 A | 9/1998 | Beaman et al. |
| 5,854,507 A | 12/1998 | Miremadi et al. |
| 5,973,391 A | 10/1999 | Bischoff et al. |
| 5,980,270 A | 11/1999 | Fjelstad et al. |
| 6,001,671 A | 12/1999 | Fjelstad |
| 6,032,359 A | 3/2000 | Carroll |
| 6,052,287 A | 4/2000 | Palmer et al. |
| 6,054,756 A | 4/2000 | DiStefano et al. |
| 6,175,159 B1 | 1/2001 | Sasaki et al. |
| 6,177,636 B1 | 1/2001 | Fjelstad |
| 6,202,297 B1 | 3/2001 | Faraci et al. |
| 6,217,972 B1 | 4/2001 | Beroz et al. |
| 6,258,625 B1 | 7/2001 | Brofman et al. |
| 6,307,260 B1 | 10/2001 | Smith et al. |
| 6,332,270 B2 | 12/2001 | Beaman et al. |
| 6,358,627 B2 | 3/2002 | Benenati et al. |
| 6,362,525 B1 | 3/2002 | Rahim |
| 6,458,411 B1 | 10/2002 | Goossen et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,545,228 B2 | 4/2003 | Hashimoto et al. |
| 6,550,666 B2 | 4/2003 | Chew et al. |
| 6,555,918 B2 | 4/2003 | Masuda et al. |
| 6,560,117 B2 | 5/2003 | Moon |
| 6,578,754 B1 | 6/2003 | Tung |
| 6,589,870 B1 | 7/2003 | Katoh et al. |
| 6,624,653 B1 | 9/2003 | Cram |
| 6,647,310 B1 | 11/2003 | Yi et al. |
| 6,681,982 B2 | 1/2004 | Tung |
| 6,767,819 B2 * | 7/2004 | Lutz ........................... 438/614 |
| 6,782,610 B1 | 8/2004 | Iijima et al. |
| 6,870,274 B2 | 3/2005 | Huang et al. |
| 6,902,869 B2 | 6/2005 | Appelt et al. |
| 2002/0056906 A1* | 5/2002 | Kajiwara et al. ............ 257/697 |
| 2002/0125571 A1 | 9/2002 | Corisis et al. |
| 2002/0153602 A1 | 10/2002 | Tay et al. |
| 2003/0107118 A1 | 6/2003 | Pflughaupt et al. |
| 2003/0132518 A1 | 7/2003 | Castro |
| 2003/0164540 A1 | 9/2003 | Lee et al. |
| 2004/0031972 A1 | 2/2004 | Pflughaupt et al. |
| 2005/0097727 A1 | 5/2005 | Iijima et al. |
| 2005/0101136 A1 | 5/2005 | Mori |
| 2005/0116326 A1 | 6/2005 | Haba et al. |
| 2005/0124091 A1 | 6/2005 | Fukase et al. |
| 2005/0285246 A1 | 12/2005 | Haba et al. |
| 2007/0017090 A1 | 1/2007 | Sakai et al. |

FOREIGN PATENT DOCUMENTS

| | | |
|---|---|---|
| JP | 62-68015 A | 9/1994 |

OTHER PUBLICATIONS

Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.

Co-Pending Patent Application No. 11/166,982, Non-final Rejection dated Mar. 21, 2008.

Co-Pending Patent Application No. 11/166,982, Amendment dated Jun. 23, 2008.

International Search Report, PCT/US2008/03473, Sep. 2008.

\* cited by examiner

FORMATION OF CIRCUITRY WITH MODIFICATION OF FEATURE HEIGHT

CROSS-REFERENCE TO RELATED APPLICATIONS

This application is a divisional of U.S. application Ser. No. 10/959,455, filed on Oct. 6, 2004, which claims the benefit of the filing dates of U.S. Provisional Patent Application Nos. 60/533,210, 60/533,393, and 60/533,437, all of which were filed Dec. 30, 2003, and 60/508,970 filed Oct. 6, 2003. The disclosures of all the aforesaid applications are hereby incorporated herein by reference.

BACKGROUND OF THE INVENTION

The present invention relates to components and assemblies useful in microelectronic assemblies, to assemblies incorporating such components and to methods of making such components and assemblies.

Microelectronic elements such as semiconductor chips typically are provided in packages that protect the semiconductor chip itself from the external environment and which facilitate mounting the chip on a circuit board. For example, some microelectronic packages include a connection component incorporating a dielectric element such as a board or sheet having top and bottom surfaces and having electrically conductive terminals exposed at the bottom surface. The chip is mounted to the top surface and connected to the terminals by various arrangements such as electrically conductive traces extending on a surface of the dielectric element, or within the dielectric element. The chip typically has a front surface with small contacts thereon and an oppositely-facing rear surface. The chip may be mounted in a face-down arrangement, so that the front surface of the chip confronts the top surface of the dielectric element and the rear surface of the chip faces upwardly, away from the dielectric element. In other cases, the chip may be mounted in a face-up arrangement, with the rear surface of the chip facing downwardly toward the top surface of the dielectric element. The contacts on the front face of the chip typically are connected to the traces on the dielectric element either by direct bonds between the contacts and leads formed integrally with the traces, or by wire bonds. As disclosed, for example, in U.S. Pat. No. 6,177,636, the disclosure of which is incorporated by reference herein, similar chip packages can be made with terminals in the form of posts projecting from the bottom surface of the dielectric element. The posts can be fabricated using an etching process.

Efforts have been made to fabricate electronic connection structures such as individual layers for multi-layer circuit boards using a metallic post structure. In one process, disclosed by the North Corporation of Tokyo, Japan, a metallic plate is etched to form numerous metallic posts projecting from the plate. A dielectric layer is applied to this plate so that the posts project through the dielectric layer. An inner or upper side of the dielectric layer faces upwardly toward the metallic plate, whereas the outer or lower side of the dielectric layer faces downwardly towards the tip of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer extending to the bases of the various posts.

The components made by this process suffer from certain drawbacks for use as connection components in certain types of semiconductor chip packages. For example, it is often desirable to mount a chip in a face-down orientation and connect the contacts on the chip to the traces of the connection component using wire bonds which extend from the chip through a large opening or slot in the dielectric element, or around the edges of the dielectric element, and approach the outer or bottom surface of the dielectric element. However, in the aforementioned process, the traces are formed on the inner or upper side of the dielectric element. Therefore, the traces are not exposed for connection to the wire bonds. While this problem can be overcome by forming additional openings in the dielectric element in alignment with the traces, this adds cost and complexity to the manufacturing process.

Moreover, the posts must have a certain minimum height in order to facilitate the process of applying the dielectric layer. Typically, the posts must be at least about 100 microns high and must be of substantially uniform height. In some applications, this is advantageous. However, where a packaged chip is to be mounted using conventional large solder balls, this substantial height may be undesirable.

It would, therefore, be desirable to provide component fabrication methods which allow fabrication of connection components using the formed-post process, but which do not suffer from the aforementioned limitations. The present invention, in its various aspects, addresses some or all of these needs.

SUMMARY OF THE INVENTION

According to an aspect of the invention, a connection component is provided for mounting a microelectronic element, which includes a dielectric layer having an upwardly-facing inside surface and a downwardly-facing outside surface. A plurality of electrically conductive traces extend on the dielectric layer remote from the outside face. The connection component also includes electrically conductive posts that extend from the traces through the dielectric layer and project downwardly by post projection distances beyond the outside surface of the dielectric layer. A plurality of electrically conductive pads extend from the traces through the dielectric layer and project downwardly by pad projection distances beyond the outside surface of the dielectric layer. The pad projection distances are less than the post projection distances. At least some of the pads are electrically connected to at least some of the posts by at least some of the traces.

According to a preferred aspect of the invention, the posts are adapted for solder-bonding to a circuit panel. Preferably, post projection distances are substantially uniform and the pad projection distances are substantially uniform. In one embodiment, the post projection distances are about 300 μm or less and the post projection distances exceed the pad projection distances by at least 25 μm.

According to a preferred aspect of the invention, the dielectric layer has a plurality of edges and edge regions adjacent the edges, and at least some of the pads project through a first one of the edge regions adjacent a first one of the edges.

According to a particular aspect of the invention, a packaged microelectronic element includes a component according to one of the above-described aspects of the invention, as well as a microelectronic element having a front face. The dielectric layer overlies a portion of the front face with the inside surface of the dielectric layer facing upwardly toward the front face such that a first contact region of the front face projects outwardly beyond the first edge of the dielectric layer. The microelectronic element has contacts exposed at the front face in the first contact region, and the packaged element further includes elongated leads that extend between at least some of the contacts and at least some of the pads.

According to a preferred aspect of the invention, the dielectric layer has a second edge opposite from the first edge and the microelectronic element includes a second edge region adjacent the second edge. The front face of the microelectronic element also includes a second contact region which projects outwardly beyond the second edge, and the pads include second-edge pads projecting through the second edge region. The microelectronic element also has second-region contacts exposed at the front surface in the second contact region, and the packaged microelectronic element further includes elongated second-edge leads extending from at least some of the second-region contacts to at least some of the second-edge pads.

According to yet another aspect of the invention, a component according to one of the above-described aspects, has a dielectric layer having an elongated slot extending through it. The dielectric layer defines a pair of slot edge regions on opposite sides of the slot, and the pads include slot-edge pads projecting through at least one of the slot edge regions.

According to yet another aspect of the invention, a packaged microelectronic element includes a component according to one of the above-described aspects of the invention, and a microelectronic element that has a front face. The dielectric layer overlies a portion of the front face with the inside surface of the dielectric layer facing upwardly toward the front face. The element has contacts exposed at the front face and aligned with the slot, and the packaged microelectronic element further includes elongated slot leads extending through the slot from at least some of the contacts to at least some of the slot-edge pads.

Preferably, the elongated leads are wire bonds. According to one preferred aspect of the invention, the traces extend on the inner surface of the dielectric layer. In a particular preferred aspect, the pads have downwardly facing surfaces, and the pads include a first metal and a layer of a second metal covering the surfaces.

According to one preferred aspect of the invention, the pads have downwardly facing surfaces, and the surfaces of the pads are substantially flat.

According to another aspect of the invention, a method is provided for treating a starting unit. The starting unit includes a dielectric layer having an inside surface and an outside surface, one or more electrically-conductive elements extending on the dielectric layer remote from the outside surface, and a plurality of posts extending from the one or more conductive elements through the dielectric layer and projecting beyond the outside surface by projection distances. Such method includes a step of reducing the projection distances of at least some of the posts.

According to a preferred aspect of the invention, the step of reducing projection distances is performed so as to leave some of the posts as pads having pad projection distances and others of the posts as posts having post projection distances that are greater than the pad projection distances.

According to particular preferred aspect, the step of reducing projection distances includes crushing less than all of the posts. Alternatively, in one preferred aspect, the step of reducing projection distances includes crushing all of the posts.

Preferably, the posts are formed from a first metal. In such case, in one preferred aspect, the method includes a step of adding an additional metal to at least some of the posts before the step of reducing projection distances. Preferably, the step of adding an additional metal includes plating the additional metal on at least some of the posts. In such case, the plating step is preferably performed so as to add the additional metal to less than all of the posts.

According to one preferred aspect of the invention, the step of adding an additional metal includes applying stud bumps to tips of at least some of the posts. In such case, the step of reducing projection distances preferably includes crushing the stud bumps.

According to another aspect of the invention, a method is provided for making a connection component. Such method includes a step of applying stud bumps to tips of metallic posts that project from a dielectric element by ball-bonding the stud bumps to the posts. Preferably, the ball-bonding operation leaves prongs projecting from the stud bumps. According to one preferred aspect, the method further includes flattening the stud bumps.

DETAILED DESCRIPTION

Figure 1:
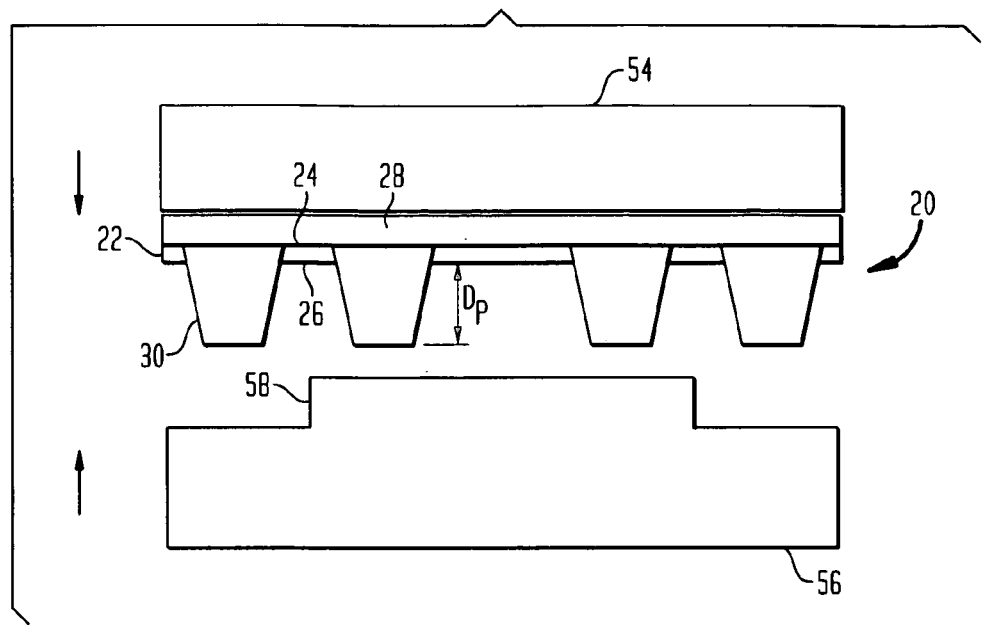
FIGS. 1-5 are sectional views illustrating stages in the fabrication of a component according to an embodiment of the invention.

A method of fabricating a component in accordance with one embodiment of the invention utilizes a starting unit which incorporates a dielectric layer 22 (FIG. 1) having an inside surface 24 facing upwardly and an outside surface 26 facing downwardly. As used in this disclosure, terms such as "upwardly," "downwardly," "vertically" and "horizontally" should be understood as referring to the frame of reference of the element specified and need not conform to the normal gravitation frame of reference. The starting unit 20 also includes an electrically-conductive element 28 which, in this instance, is a unitary, generally planar metallic layer disposed on the dielectric remote from the outside surface 26. As used in this disclosure, when a conductive element is said to be "on" a dielectric element or layer, the conductive element need not be disposed on a surface of the dielectric, but instead, may be disposed within the dielectric. That is, the word "on" does not imply location at a surface of a dielectric. However, in the particular embodiment shown, metallic layer 28 is disposed in contact with the inner surface 24 of the dielectric layer.

Unit 20 further includes a plurality of electrically-conductive posts 30 projecting from the conductive element 28 through at least a portion of the dielectric layer and, in this instance, through the entire dielectric layer and projecting beyond the outside surface 26 of the dielectric layer by a projection distance $D_P$. Merely by way of example, starting unit 20 may include a conductive layer 28 about 10-50 microns thick and a dielectric layer 22 about 10-100 microns thick, with posts 30 projecting by distance $D_P$ of about 50 to about 300 microns.

Figure 2:
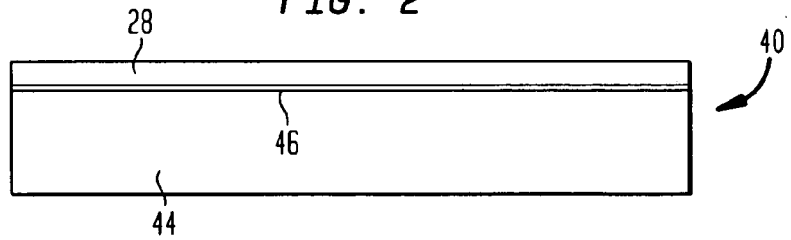
Figure 3:
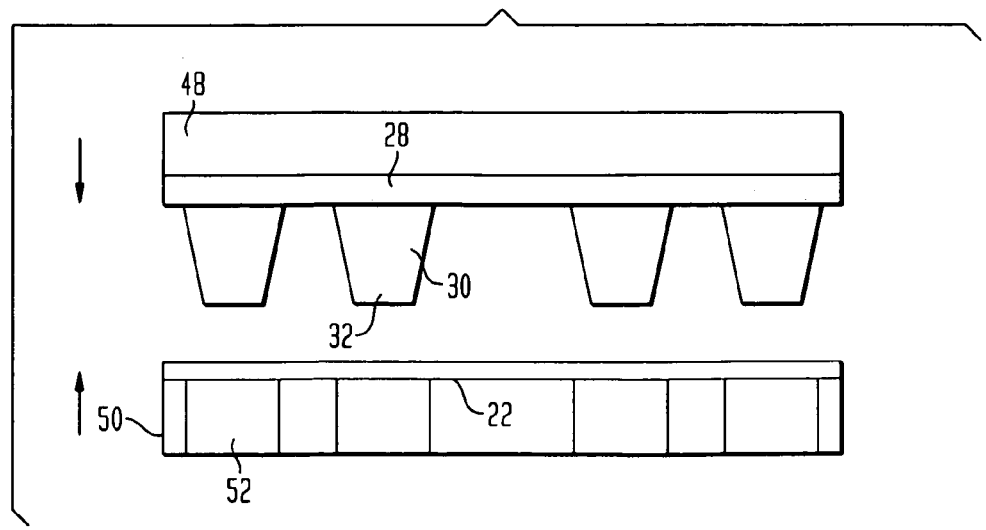

Unit 20 is referred to in the discussion below as a "starting" unit, inasmuch as other steps of the process in accordance with certain aspects of the present invention are performed beginning with such a unit. Units of this type can be fabricated by various processes. However, one process for making the starting unit 20 is depicted schematically in FIGS. 2 and 3. As shown in FIG. 2, a metallic laminate 30 may include a first layer 28 and a second layer 44 of a thickness adapted to form the posts, with or without a very fine interfacial layer 46 of an "etch-stop" material having etching properties different from those of layer 44 at the interface between layers 42 and 44. Spots of a resist (not shown) are applied on the exposed surface of layer 44 where the posts are to be formed, and a resist may also be applied on the exposed surface of layer 46. Referring to FIG. 3, the metallic structure is then exposed to an etchant, which attacks layer 44, leaving posts 30 projecting from layer 28. The metallic structure is then united with a dielectric layer 22 as, for example, by squeezing the metallic structure and layer 22 between a pair of opposed dies 48 and 50, so that the dielectric layer 22 is engaged with the tips 32 of posts 30 and the tips penetrate through the dielectric layer and enter into holes 52 in die 50. The dielectric layer is forced upwardly along posts 30 and into engagement with conductive layer 28. The dielectric layer may be provided with a separate adhesive. Alternatively, dielectric layer 22, at this stage of the process, may be only partially cured and may have adhesive properties. For example, where dielectric layer 22 is formed from a polyimide, the polyimide may be only partially cured at the time the dielectric layer is united with the metallic structure, and the curing may be completed so that the dielectric layer bonds to conductive layer 28.

The foregoing steps illustrated with reference to FIGS. 2 and 3 are merely exemplary. Other methods of forming the starting unit 20 (FIG. 1) may be used. Merely by way of example, dielectric layer 22 may be cast or molded around posts 30 as, for example, by engaging the metallic structure of FIG. 3 in a compression mold or injection mold, so that the posts sealingly engage the mold at a location along the lengths of the posts, and injecting the uncured dielectric around the posts so as to form the dielectric layer in place. Alternatively, the dielectric may be applied as a flowable material and may flow to form a layer surrounding the posts under the influence of gravity or under the influence of centrifugal force applied in a centrifuge or similar device.

Figure 4:
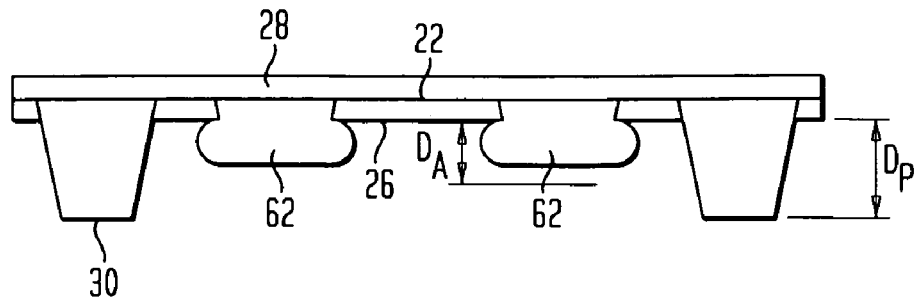

After the starting unit 20 (FIG. 1) has been fabricated or otherwise provided, the unit is treated by engaging it between a further pair of dies 54 and 56. Die 54 is generally smooth, whereas die 56 has a ridge 58 disposed in alignment with some of posts 30 and out of alignment with others of the posts. The dies are moved forcibly towards one another, so that those posts 30 overlying ridge 58 are crushed. In the particular arrangement illustrated, posts 30 are provided in rows normal to the plane of the drawing as seen in FIG. 1, and ridge 58 is elongated in the direction normal to the plane of the drawing so that the ridge engages numerous posts of two adjacent rows. Also, in the particular arrangement illustrated, the dies are moved towards one another in a linear motion. However, this is not essential. For example, the dies may be in the form of rollers, and the starting unit may be an elongated strip or tape having rows of posts extending in its direction of elongation. The rollers are rotated so as to draw the strip or tape through a nip defined by the rollers, so that a ridge on one roller engages the various posts of particular rows, but leaves the other posts unaffected. The dies may have configurations other than the ridged configurations illustrated. For example, die 56 may be made in the form of a flat plate or roller having a flat or cylindrical outer surface arranged to engage and crush particular rows of posts, and having holes or pockets arranged to receive posts in other rows so that these other posts remain substantially unaffected by passage through the dies. The resulting structure (FIG. 4) has some of the original posts projecting from the outer surface 26 of the dielectric layer 22 by the original height or projection distance $D_P$, and has some pads 62 formed by crushing the posts. The pads 62, like posts 30, project from conductive element 28 and project beyond the outer surface 26 of the dielectric layer. However, the projection distance $D_A$ of the pads is significantly less than the projection $D_P$ of the posts. Desirably, the difference between the projection distance of the pads and the projection distance of the posts ($D_P$–$D_A$) is at least about 25 microns and more desirably about 50 microns or more. Most preferably, $D_A$ is less than about 100 microns, more preferably less than about 50 microns and most preferably about 25 microns or less. Stated another way, in this embodiment, engagement with the dies serves to reduce the height or projection distances of some, but less than all, of the original posts, so as to convert these posts into the pads 62.

Electrically conductive layer 28 is etched or otherwise processed so as to subdivide the layer into numerous separate electrically conductive elements in the form of traces 28' (FIG. 5) which extend on the dielectric layer 22, in this particular case on the inside surface 24 of the dielectric layer. The traces 28' interconnect pads 62 and posts 30 with one another. A slot 66 is formed in the central region of the dielectric layer so that the slot extends between the rows of pads, and the pads are disposed adjacent the edges of the slot. Slot 66 may be formed, by example, by mechanically punching the dielectric layer; by ablating the dielectric layer using a laser or other concentrated energy source; or by chemically etching the dielectric layer.

Figure 5:
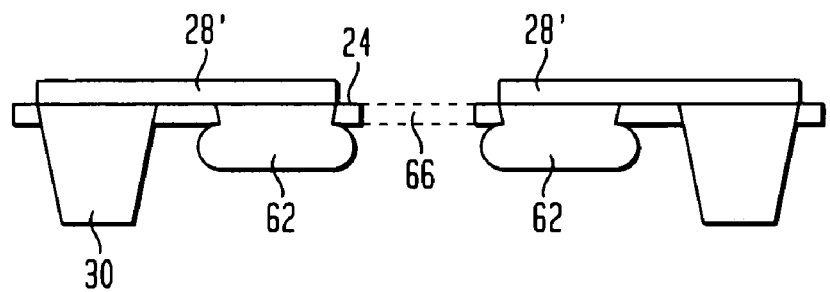

The order of steps used to make the component can be varied from that discussed above. For example, the conductive layer 28 may be in the form of individual conductive features or traces 28' in the starting unit, so that the individual conductive features are present when the step of reducing the height of the posts to form the pads is performed. Also, the step of forming a slot in the dielectric layer can be performed before or after the height reduction step, and before or after the step forming the individual traces. Also, the various steps can be, and most preferably are, conducted while the dielectric layer 22 is part of a larger sheet or tape. Individual connection components as depicted in FIG. 5 can be obtained by severing such a sheet or tape. Most typically, however, the connection components are left in the form of a sheet or tape until after semiconductor chips or other devices are mounted to the components.

Figure 6:
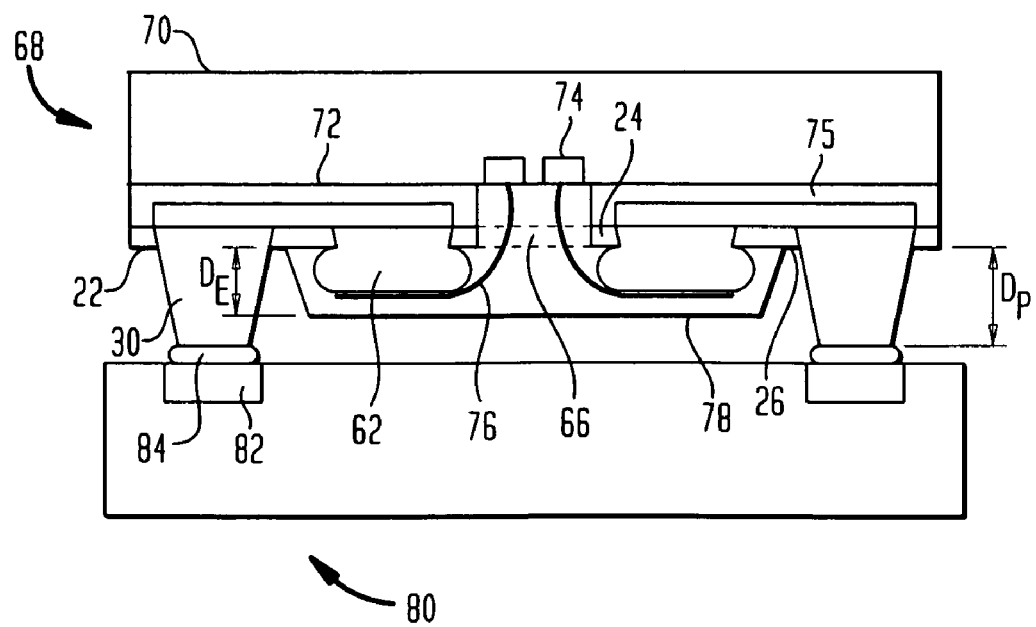
FIG. 6 is a sectional view illustrating a packaged microelectronic element which includes a component according to the embodiment illustrated in FIG. 5, as mounted to a circuit panel.

As shown in FIG. 6, a packaged microelectronic element 68 made using the component of FIG. 5 incorporates a semiconductor chip or other microelectronic element 70 having a front face 72 and contacts 74 disposed in rows on the front face. The component and semiconductor chip are assembled so that the dielectric layer 22 of the component overlies the front face, with the inner surface 24 of the dielectric layer facing toward the front face of the chip. The chip has contacts 74 disposed in one or more rows. These rows of contacts are aligned with the slot 66 in the dielectric layer. A die attach composition 75 is provided between the front face of the chip and the inside surface of the dielectric layer. Typically, this die attach material includes a dielectric adhesive. Optionally, the die attach material may be a compliant material so as to facilitate movement of post 30 and other elements of the connection component relative to the chip during testing and service. The contacts 74 of the chip are connected to pads 62 by wire bonds 76 extending through slot 66. After the contacts have been wire bonded to the pads, a dielectric encapsulant 78 is applied over the pads and wire bonds and typically fills slot 66, so that the encapsulant covers the contact 74 on the chip and also contacts the die attach material 75. An additional overmold (not shown) may be provided around the chip, so that the overmold covers the exposed edges of the chip and, in some applications, also covers the upwardly-facing rear surface of the chip to provide additional physical protection.

Desirably, the height or projection distance $D_E$ Of the encapsulant from the bottom or outside surface 26 is less than or equal to the height or projection distance $D_P$ of the posts. Also, the height or projection distance of the wire bonds 76 is less than $D_P$ and less than $D_E$, so that the wire bonds are entirely covered by the encapsulant. Stated another way, the difference in height or projection distance between the pads 62 and posts 30 is sufficient to accommodate the thickness of the wire bonds overlying the pads and the thickness of the encapsulant overlying the wire bonds. The wire bonding and encapsulation steps may be performed using conventional equipment and procedures. As mentioned above, the components are typically provided in the form of a sheet or tape including numerous components. The chips are mounted to these components and the wire bonding and encapsulation procedures preferably are performed while the connection components are in the form of a sheet or tape. After the procedures have been performed, the sheet or tape typically is severed so as to yield numerous individual units, each incorporating one or more chips.

The completed chips can be tested by engaging posts 30 with a test fixture (not shown). In some cases, the posts 30 may be displaced vertically towards or away from chip 70 during the testing procedure, so as to assure proper engagement of all of the posts 30 with the test fixture. Such movement can be facilitated by making the dielectric layer 22 and traces 28' flexible and by providing compressibility in the die attach layer 75. The testing operation can be performed before or after severance of the individual units of the tape and before or after application of encapsulant 78. If the testing operation is performed before application of the encapsulant and overmold, wire bonds 76 that are defective and detected in the testing operation can be reworked.

Packaged microelectronic element 68 may be mounted to a circuit panel 80 such as a circuit board, partially illustrated in FIG. 6. Posts 30 may be bonded to contact pads 82 on the top surface of the circuit board using conventional surface-mounting techniques. Preferably, only a thin layer of a bonding material 84 such as a solder is provided between the tips of the posts 30 and the contact pads 82. Some of the bonding material may also extend upwardly along the posts (not shown), so that the ends of the posts remote from dielectric layer 22 are engaged within masses of bonding material. In the conventional manner, circuit panel 80 includes conductive elements such as traces (not shown) connecting the contact pads 82 with other elements of an electronic circuit. Encapsulant 78 remains clear of the circuit board top surface.

In the completed circuit, the posts 30 desirably can move or tilt slightly to accommodate movement of the contact pads 82 on the circuit board relative to the contact 74 of the chip as may be caused, for example, by differential thermal expansion and contraction of the elements during operation and contraction during manufacture as, for example, during the solder bonding process.

Figure 7:
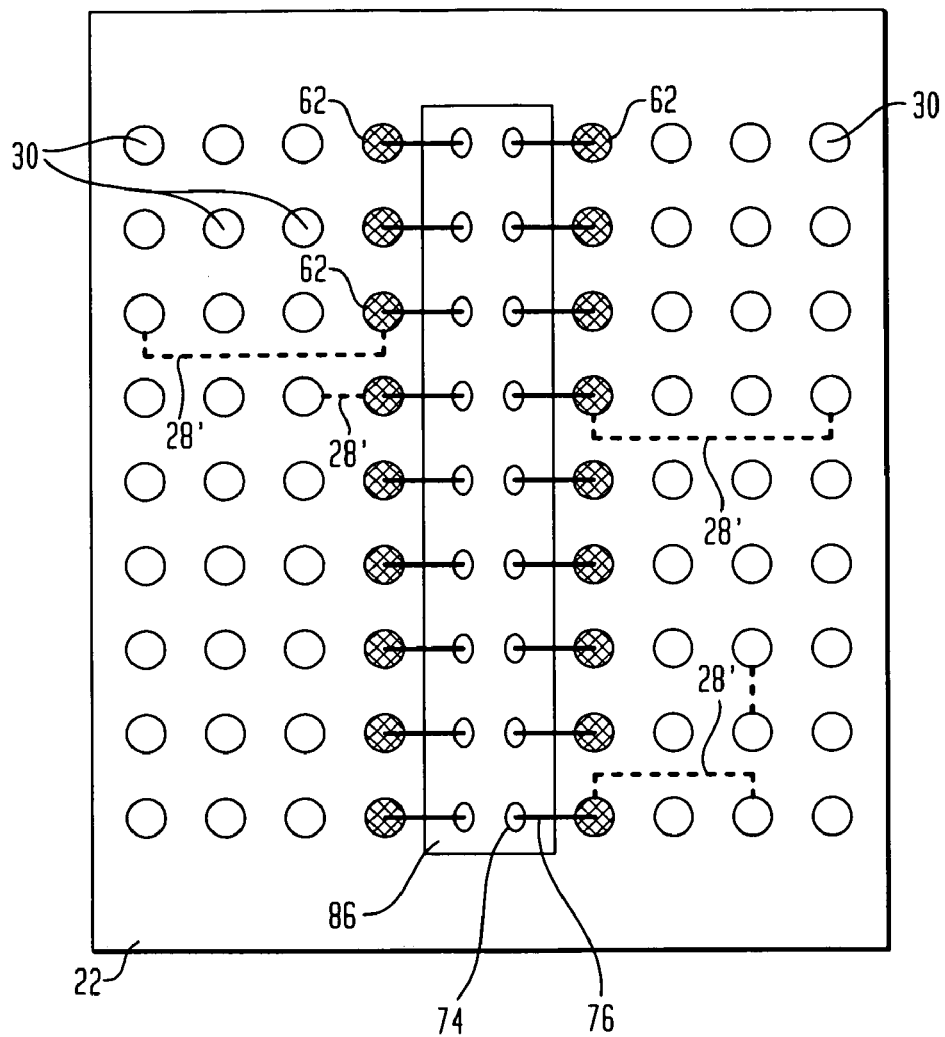
FIG. 7 is a bottom plan view of the packaged microelectronic element according to the embodiment illustrated in FIG. 6.

The depictions in FIG. 1-6 are simplified for clarity of illustration. Typically, the component includes more than one row of posts on each side of the slot. As seen in the bottom plan view of FIG. 7, the dielectric layer 22 may be generally rectangular, and slot 66 may be elongated. One or more rows of pads 62 are provided in slot-edge regions adjacent the edges of the slot, whereas numerous rows of posts 30 are provided in other regions of the dielectric layer. The pads 62 are connected to the posts 30 by traces 28' as discussed above. As also shown in FIG. 7, each pad may be connected to one or more posts, and the posts may be interconnected with one another by some of the traces. For clarity of illustration, only a few of the traces 28' are shown in FIG. 7. The conductive features on the dielectric layer may also include other conductive elements as, for example, electrically conductive planes which serve as ground or power planes and which may be connected to some of the posts and/or pads.

It is not essential to provide the slot in the center of the dielectric element. Thus, the slot 66 can be offset from the center of the dielectric element. Also, two or more slots can be provided in a single dielectric element. In a further modification, the slot may be replaced by a set of discrete openings, each encompassing one or more of the contacts 74 on the chip, and the wire bonds may extend through these openings.

Figure 8:
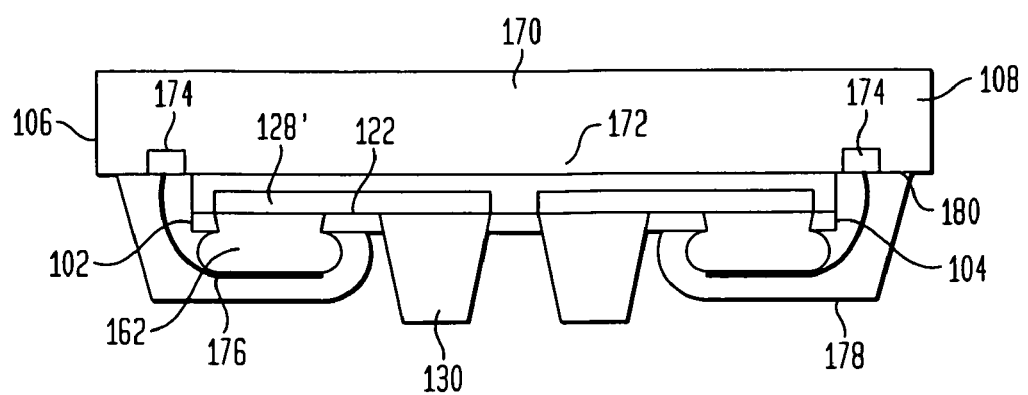
FIG. 8 is a sectional view illustrating a packaged chip according to another embodiment of the invention.

With reference to FIG. 8, a packaged chip in accordance with a further embodiment of the invention includes a connection component having a dielectric layer 122, pads 162, posts 130 and electrically-conductive features such as traces 128' fabricated in substantially the same manner as discussed above and similar to the corresponding features discussed above. In this embodiment, however, the dielectric layer has opposed edges 102 and 104, and the pads 62 are formed in edge regions of the dielectric layer adjacent these edges. Thus, where a forming tool is engaged with posts to crush them and form the pads, the forming tool has appropriate features to engage the posts in the edge regions and desirably leaves the posts in the central region of the dielectric layer, between the edge regions, unaffected. In this embodiment as well, a chip 170 is mounted with its front or contact-bearing face facing downwardly toward the dielectric element. The chip has opposed edges 106 and 108, and edge regions 180 of the chip front surface project outwardly beyond edges 102 and 104 of the dielectric layer. The contacts 174 of the chip are disposed in these edge regions of the chip front surface as, for example, by providing one or more rows of contacts in each edge region. The wire bonds 176 extend from the contacts 174 and extend around the edges 102 and 104 of the dielectric layer. An encapsulant 178 covers the wire bonds and covers the edge regions of the chip and the edges of the dielectric layer 128. In a further variant, the encapsulant may also cover the edges of the chip so as to provide physical protection to the edges of the chip. Alternatively, a further overmold may be provided around the chip. It is not essential to provide pads and wire bonds at only two opposed edges. For example, the pads and wire bonds may be provided at four edges of a rectangular dielectric element, and the chip may have edge regions extending beyond all of those edges. Conversely, the chip may extend beyond only one edge of the dielectric element, and pads may be provided only at that edge. Also, the edge pad approach exemplified in FIG. 8 may be combined with the slot edge pads as shown in FIGS. 6 and 7, so that pads are provided both at the outer edges of the dielectric element and along the edges of one or more slots in the dielectric element.

Figure 9:
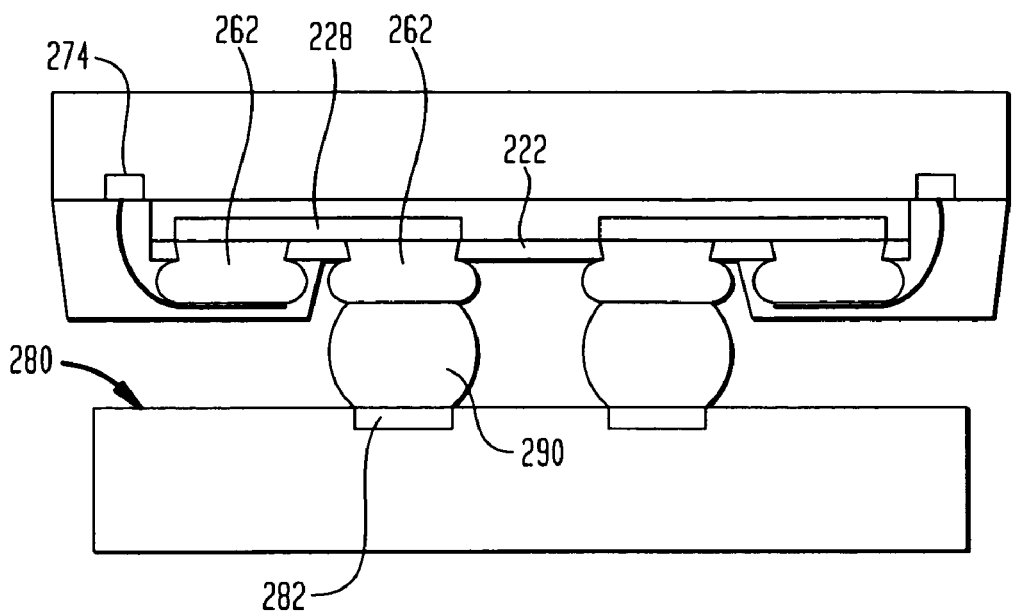
FIG. 9 is a sectional view illustrating a packaged chip according to yet another embodiment of the invention, as mounted to a circuit panel.

In the embodiments discussed above, the height reduction step used to convert posts to pads was performed so as to affect less than all of the posts. However, referring to FIG. 9, in a variant of this step, all of posts may be crushed or otherwise modified so as to reduce the heights of all of the posts and form all of the posts into pads having equal projection distances or heights from the dielectric element. The resulting packaged microelectronic element has numerous pads 262, all of substantially uniform height or projection distance from the dielectric element 222. Some of the pads 262 are connected to the contacts 274 of the chip and are desirably covered by the encapsulant. Others of the pads 262 remain uncovered. The electrically conductive traces 228 interconnect the pads with one another.

In use, the assembly may be mounted to a circuit panel such as a circuit board 280 using solder balls 290 or other conductive elements to provide a standoff between the pads 262 and the contact pads 282 of the circuit board. This arrangement can be used regardless of whether the wire bonds extend around the edges of the dielectric element or through slots in the dielectric element, or both. This arrangement also can be used where connections to the chip are made using elements other than wire bonds. For example, the chip may be connected to traces 228 by bonding the contacts of the chip directly to the traces using an electrically conductive bonding material, or by bonding the chip contacts to leads formed integrally with the traces. Connection components having leads suitable for such bonding are depicted in preferred embodiments of U.S. Pat. No. 6,054,756, the disclosure of which is hereby incorporated by reference herein.

The manufacturing process can be varied. For example, the step of reducing the height of some or all of the posts need not be performed by the crushing operation discussed above. Other mechanical procedures such as cutting or abrasion can be used. Also, chemical or electrochemical etching and ablation can be used. Any of these procedures can be employed selectively, so as to reduce the height of only some of the posts, or non-selectively, so as to reduce the height of all of the posts. In a further alternative, the height reducing step may be conducted so as to reduce the height of all of the posts, but reduce the height of some of the posts by a greater amount than others of the posts. For example, in a crushing operation, the dies may crush some of the posts by a substantial amount so as to form pads, and to crush others of the posts only slightly, so that these posts still have a relatively large height after crushing.

Figure 10:
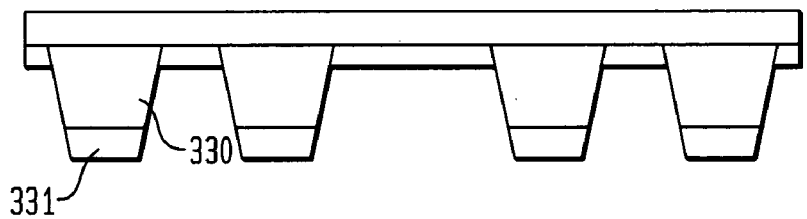
FIG. 10 is a view illustrating a stage in the fabrication of a component according to an embodiment of the invention.

As seen in FIG. 10, the tips 331 of posts 330 may be covered with a layer of gold or other corrosion-resistant, anti-oxidant metal prior to the height reduction step. This may be performed either before or after applying the dielectric layer. The coating may be provided by forcibly engaging the tips of the posts with a thin layer of the desired metal. Because all of the posts have a substantially uniform height at this stage, such process can be performed readily. If the height reduction step is performed by crushing some or all of the posts as discussed above, the corrosion-resistive metal will also be present on the surfaces of the resulting pads.

Figure 11:
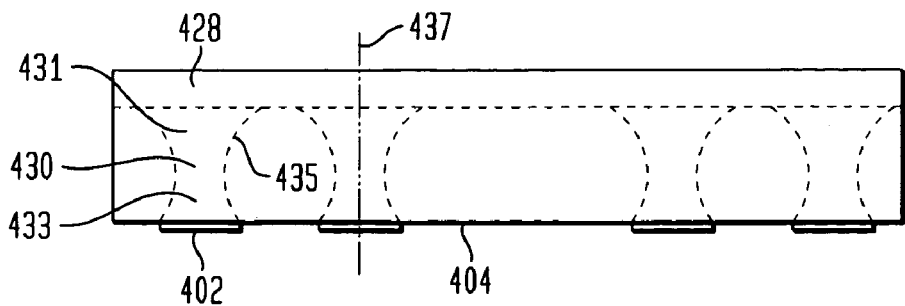
FIG. 11 is a sectional view illustrating fabrication of a component according to another embodiment of the invention.

In the discussion above, the posts have been idealized as substantially frustoconical elements. However, it is not essential for the posts to have this shape. As seen in FIG. 11, and as discussed in greater detail in the aforementioned U.S. Pat. No. 6,177,636, posts may be formed by applying an etch-resistant material, which may be a photoresist or a corrosion-resistant metal such as nickel, gold or the like, on a surface 404 of a metallic plate or sheet. After application of the etch-resistant material, an etchant is applied to this surface, typically in the form of a spray directed normal to the surface 404. The metal of the plate or sheet may be etched to form the configuration shown in broken lines in FIG. 11. In this configuration, the posts 430 have a "cooling tower" shape. Each post has a base 431 connected to the remaining portion 428 of the original sheet or plate, a tip 433 remote from the base and an intermediate portion 435 between the base and tip. The intermediate portion 435 is narrower than the tip portion 433 and narrower than the base 431, so that the post tapers inwardly in the direction from the base to the intermediate portion and tapers outwardly from the intermediate portion to the tip. Where spots 402 of the etch-resistant material are round, the posts typically have the shape of bodies of revolution about axes 437 extending normal to surface 404 and normal to the surface of remaining portion 428. Where the etch-resistant material 402 is a photoresist or other material that is not desired in the final product, the etch-resistant material may be removed before further processing. Alternatively, if the etch-resistant material is a corrosion-resistant metal such as nickel or gold, it may be left in place. As discussed above, when the posts are crushed, the etch-resistant material will remain at the surfaces of the resulting pads.

In accordance with a further embodiment of the invention, an additional metal 531 is applied onto posts 530 (FIG. 12) of a starting unit. In this embodiment, the additional metal 531 is applied only on those posts that are to be subsequently reduced in height to form pads. For example, a temporary mask 501 may be deposited over the other posts, and the additional metal may be applied by electroplating. Additional metal 531 is shown separately from the posts for clarity of illustration. Desirably, however, the additional metal merges with the metal of the posts to form a substantially unitary body. The additional metal may be of the same composition as the metal constituting the posts. For example, where the posts are formed from copper, the additional metal 531 may be copper. Alternatively, the additional metal may have a composition different from that of the posts. Desirably, the additional metal substantially increases the mass of metal present in each post where it is deposited and increases the cross-sectional area of each such post, as measured in a horizontal plane.

Figure 13:
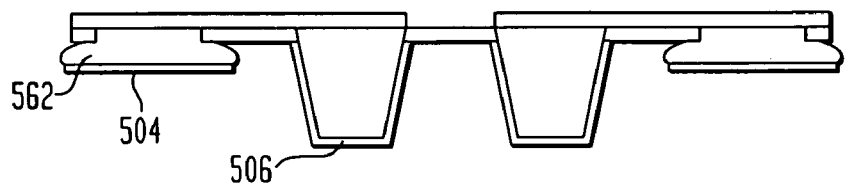

After deposition of the additional metal, those posts that have been treated by such deposition are crushed or otherwise reduced in height so as to form pads 562 (FIG. 13). The height reduction operation may include processes such as etching, grinding or polishing in addition to crushing, or in lieu thereof. After the height reduction operation, the pads 562 may be plated with one or more additional layers 504 so as to provide readily wire-bondable surfaces. Where the posts and the additional metal are formed from copper, the additional layers 504 may include gold, with or without a layer of nickel between the copper and the gold. Similar additional layers 506 may be applied on the remaining posts, typically in the same plating step.

Figure 14:
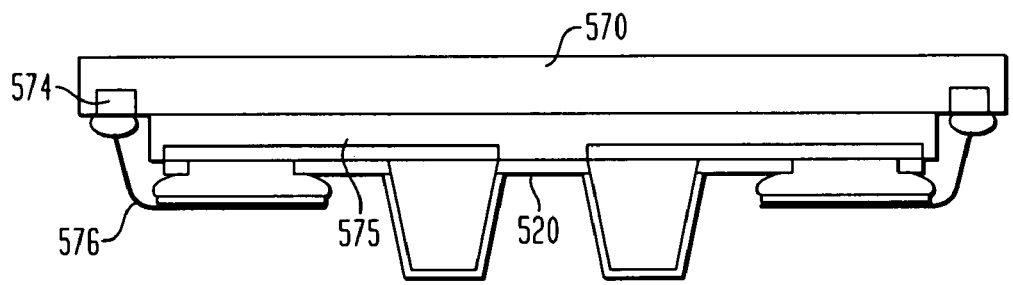

As shown in FIG. 14, the resulting component can then be assembled to a semiconductor chip or other element 570 FIG., and the contacts 574 of the chip may be connected by wire bonds 576 to the contacts 574 of the chip or other element. One or more layers 575 desirably including a die attach material and a compliant material may be provided between the chip and the dielectric layer 520 as discussed above. FIG. The fabrication process discussed above with reference to FIGS. 12-14 may be used regardless of whether the pads are formed adjacent the edges, or adjacent slots or holes in the dielectric layer.

Figure 12:
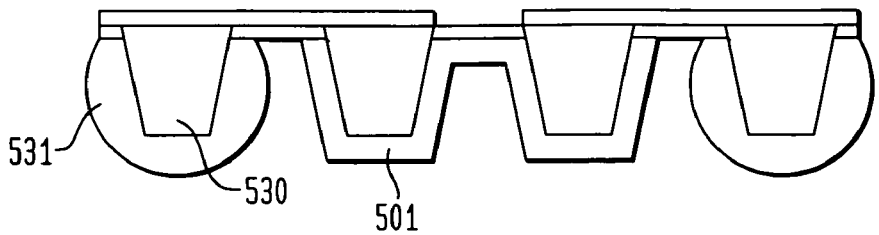
FIGS. 12-14 are sectional views illustrating a component, its fabrication, and mounting to a microelectronic element, according to yet another embodiment of the invention.

In further variants of the process shown in FIGS. 12-14, the additional metal may be provided on all of the posts, including those which are not subjected to any height reduction step. In yet another variant, the additional metal may be provided on all of the posts, and some of the posts may be subjected to different degrees of height reduction.

Figure 15:
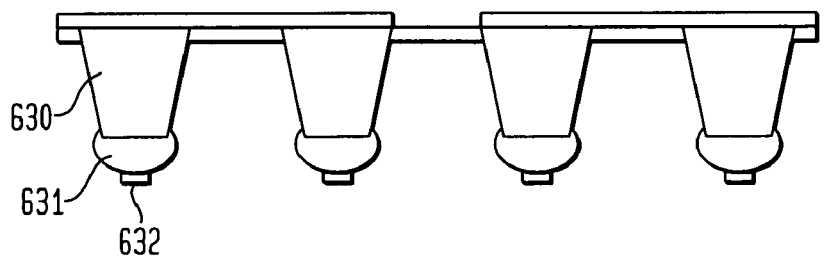
FIG. 15 is an elevational view illustrating a component according to another embodiment of the invention.

As shown in FIG. 15, in a process according to yet another embodiment of the invention, a starting unit having posts 630 is provided with additional metal 631 on the tips of the posts prior to the height reduction operation by applying stud bumps using a wire bonder. The wire bonder itself may be a generally conventional wire-bonding apparatus, commonly referred to as a ball bonder. A ball bonder typically utilizes a tool having an end face and an opening for feeding a continuous wire to the end face. A ball is formed on the end of the wire as, for example, by heating the wire end so as to form the ball by melting it. The ball is engaged between the end face of the tool and the tip of the post, and the ball is bonded to the posts by applying pressure and, typically, heat and sonic vibrations through the tool. After the ball is fused to the tip of the post, the tool is withdrawn slightly and the wire is broken or melted near the ball, leaving a small prong 632. The stud bumps may be formed from essentially any metal suitable for wire-bonding, but most typically are formed from gold or a gold alloy.

Figure 16:
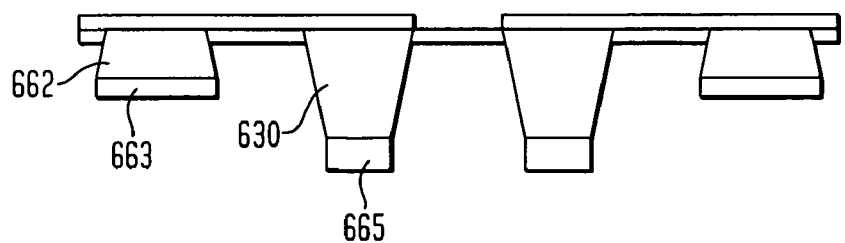
FIG. 16 is an elevational view illustrating a component according to yet another embodiment of the invention.

As seen in FIG. 16, some of the posts are reduced in height by crushing them substantially so as to form pads 662. The crushing operation also serves to flatten the stud bumps and the prongs formed by the wire so as to provide substantially flat additional metal layers 663 on the pads 662. Optionally, the other posts 630 may be subjected to a slight crushing operation at the same time as the posts are crushed to form the pads, or at a different time, so as to flatten the stud bumps associated with those posts and form flat additional metal layers 665 on the tips of those posts. Alternatively, the posts that are not crushed to form pads may remain in the condition illustrated in FIG. 15 after stud bumping, with protruding prong 632. This alternative may be used, for example, where the posts are to be solder-bonded to contacts of a circuit panel. In a further alternative, the stud bumps may be omitted from those posts that will not be crushed to form the pads. In yet another arrangement, the stud-bumping operation, with or without a subsequent operation to flatten the protruding wire prongs, can be used to provide additional metal on the tips of the posts regardless of whether posts are crushed to form pads.

The connection components discussed above can be utilized in assemblies which are mated with sockets rather than surface-mounted to a circuit board. For example, a packaged semiconductor chip as discussed above can be mounted to a socket, with each of the posts extending into a mating hole in the socket and making electrical contact with a contact of the socket. Certain suitable sockets are described in embodiments of U.S. Pat. Nos. 5,802,699; 5,980,270 and 5,615,824, the disclosures of which are incorporated by reference herein. In a further alternative, the socket arrangement can be used as a temporary test fixture and, after testing, the assembly can be solder-bonded or otherwise bonded to a circuit board.

The assemblies discussed above include relatively simple components with only a single layer of conductive traces, such as traces 28' discussed above. However, more than one layer of traces can be used, and other conductive features such as conductive planes can be included.

As these and other variations and combinations of the features discussed above can be utilized without departing from the present invention, the foregoing description of the preferred embodiments should be taken by way of illustration rather than by way of limitation of the present invention.

The invention claimed is:

1. A method of treating a starting unit including a dielectric layer having first major surface and a second major surface, one or more electrically-conductive elements extending on said dielectric layer remote from said first major surface, and a plurality of posts extending from said one or more conductive elements through said first major surface of said dielectric layer and projecting beyond said second major surface by projection distances, said method including the step of reducing the projection distances of at least some of said posts to form conductive pads, wherein a portion of said posts or said pads remains exposed for external interconnection with a microelectronic element.

2. A method as claimed in claim 1 wherein said step of reducing projection distances is performed so as to leave some of said posts as pads having pad projection distances and others of said posts as posts having post projection distances greater than said pad projection distances.

3. A method as claimed in claim 2 wherein said step of reducing projection distances includes crushing less than all of said posts.

4. A method as claimed in claim 1 wherein said step of reducing projection distances includes crushing all of said posts.

5. A method as claimed in claim 1 wherein said posts are formed from a first metal, the method further comprising the step of adding an additional metal to at least some of said posts before said step of reducing projection distances.

6. A method as claimed in claim 5 wherein said step of adding an additional metal includes plating said additional metal on at least some of said posts.

7. A method as claimed in claim 6 wherein said plating step is performed so as to add said additional metal to less than all of said posts.

8. A method as claimed in claim 5 wherein said step of adding an additional metal includes applying stud bumps to tips of at least some of said posts.

9. A method as claimed in claim 8 wherein said step of reducing projection distances includes crushing said stud bumps.

10. A method as claimed in claim 1, further comprising making a connection component by applying stud bumps to tips of metallic posts projecting from a dielectric element by an operation of bail-bonding said stud bumps to said posts.

11. A method as claimed in claim 10 wherein said ball-bonding operation leaves prongs projecting from said stud bumps.

12. A method as claimed in claim 10 further comprising flattening said stud bumps.

13. A method as claimed in claim 11 further comprising flattening said stud bumps.

14. A method as claimed in claim 1, wherein said posts are of frustoconical shape.

15. A method as claimed in claim 1, wherein said posts are formed of copper.

* * * * *